(12) United States Patent
Chang et al.

(10) Patent No.: US 10,802,553 B1
(45) Date of Patent: Oct. 13, 2020

(54) ELECTRONIC DEVICE

(71) Applicants: INVENTEC (PUDONG) TECHNOLOGY CORPORATION, Shanghai (CN); INVENTEC CORPORATION, Taipei (TW)

(72) Inventors: Kuo En Chang, Taipei (TW); Ming-Hung Shih, Taipei (TW); Hong-Jie Jian, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/563,524

(22) Filed: Sep. 6, 2019

(30) Foreign Application Priority Data

Jun. 6, 2019 (CN) .......................... 2019 1 0491856

(51) Int. Cl.
*G06F 1/20* (2006.01)
*G06F 1/18* (2006.01)
*H05K 7/20* (2006.01)

(52) U.S. Cl.
CPC ................ *G06F 1/20* (2013.01); *G06F 1/184* (2013.01); *H05K 7/20154* (2013.01); *H05K 7/20172* (2013.01); *G06F 2200/201* (2013.01)

(58) Field of Classification Search
CPC . G06F 1/184; G06F 1/20; G06F 1/203; G06F 2200/201; H05K 7/20154; H05K 7/20172
See application file for complete search history.

(56) References Cited

U.S. PATENT DOCUMENTS

| 7,580,259 | B2* | 8/2009 | Hsiao | G06F 1/20 |
| | | | | 361/679.48 |
| 8,625,276 | B2* | 1/2014 | Chen | G06F 1/20 |
| | | | | 361/679.48 |
| 2005/0141191 | A1* | 6/2005 | Long | G06F 1/20 |
| | | | | 361/690 |
| 2008/0101021 | A1* | 5/2008 | Sanchez | H05K 7/20172 |
| | | | | 361/695 |
| 2010/0107397 | A1* | 5/2010 | Letourneau | H05K 7/20581 |
| | | | | 29/453 |
| 2011/0228476 | A1* | 9/2011 | Lin | G06F 1/185 |
| | | | | 361/695 |
| 2011/0317362 | A1* | 12/2011 | Chen | G06F 1/20 |
| | | | | 361/695 |

(Continued)

*Primary Examiner* — Jacob R Crum
(74) *Attorney, Agent, or Firm* — Maschoff Brennan

(57) ABSTRACT

An electronic device comprises a housing, and a fan connection member. The housing comprises a bottom plate having a motherboard mounting area. The fan connection member is disposed on the bottom plate, and an orthogonal projection of the fan connection member onto the bottom plate partially overlaps with the motherboard mounting area. The fan connection member includes a fan base and a fan seat pivoted on the fan base. The orthogonal projection of the fan connection member has a first overlap area on the motherboard mounting area at a working state of the fan connection member. The orthogonal projection of the fan connection member has a second overlap area on the motherboard mounting area at a maintenance state of the fan connecting member. The first overlap area is larger than the second overlap area.

8 Claims, 12 Drawing Sheets

(56) References Cited

U.S. PATENT DOCUMENTS

| | | | | |
|---|---|---|---|---|
| 2012/0014811 | A1* | 1/2012 | Wei | F04D 29/601 |
| | | | | 417/1 |
| 2013/0109288 | A1* | 5/2013 | Tang | H05K 7/20172 |
| | | | | 454/184 |
| 2013/0168066 | A1* | 7/2013 | Wang | G06F 1/20 |
| | | | | 165/122 |
| 2014/0086732 | A1* | 3/2014 | Kelaher | H05K 7/20145 |
| | | | | 415/175 |
| 2014/0118937 | A1* | 5/2014 | Adrian | H05K 7/20172 |
| | | | | 361/695 |
| 2014/0119911 | A1* | 5/2014 | Deng | F04D 29/646 |
| | | | | 415/220 |
| 2014/0147313 | A1* | 5/2014 | Deng | H05K 7/20727 |
| | | | | 417/423.15 |
| 2015/0351280 | A1* | 12/2015 | Gonzalez Inda | G06F 1/181 |
| | | | | 361/695 |
| 2020/0015386 | A1* | 1/2020 | Gupta | H05K 7/20172 |

* cited by examiner

ELECTRONIC DEVICE

CROSS-REFERENCE TO RELATED APPLICATIONS

This non-provisional application claims priority under 35 U.S.C. § 119(a) on Patent Application No(s). 201910491856.6 filed in China on Jun. 6, 2019, the entire contents of which are hereby incorporated by reference.

BACKGROUND

1. Technical Field

This disclosure relates to an electronic device, and more particularly to an electronic device with a fan connection member.

2. Related Art

As the development of the Internet, a specific model of electronic devices is designed for specific professional demand, and the development of various motherboards is required for various models. However, the cost in the development of motherboards is very high and complicated. Thus, if a motherboard is designed to be compatible with different electronic devices, the development cost can be reduced.

To use the same type of motherboard in different housings, various mechanism limitations must be solved. For example, in the case where the size of the housing is limited (such as 27 inches), the space above the fan connector of the motherboard is insufficient to accommodate a fan module, and other space for mounting a fan module in the housing is misaligned with the fan connector and with a certain distance. Thus, the fan module cannot be directly connected to the fan connector, and it leads to failing to share a motherboard.

SUMMARY

According to one embodiment of this disclosure, an electronic device comprises a housing and a fan connection member. The housing comprises a bottom plate having a motherboard mounting area. The fan connection member is disposed on the bottom plate, and an orthogonal projection of the fan connection member onto the bottom plate overlaps a part of the motherboard mounting area. The fan connection member comprises a fan base and a fan seat pivoted on the fan base. The orthogonal projection of the fan connection member onto the bottom plate has a first overlap area on the motherboard mounting area at a working state of the fan connection member. The orthogonal projection of the fan connection member onto the bottom plate has a second overlap area on the motherboard mounting area at a maintenance state of the fan connection member. The first overlap area is larger than the second overlap area.

According to one embodiment of this disclosure, an electronic device includes a housing, a fan connection member, a motherboard, a memory, a CPU, and a fan module. The housing includes a bottom plate having a motherboard mounting area. The fan connection member is disposed on the bottom plate, and an orthogonal projection of the fan connection member onto the bottom plate overlaps a part of the motherboard mounting area. The fan connection member includes a fan base and a fan seat pivoted on the fan base. The motherboard is disposed on the motherboard mounting area of the bottom plate. The fan seat is electrically connected to the motherboard, and a part of the motherboard is located between the fan base and the bottom plate. The orthogonal projection of the fan connection member onto the bottom plate has a first overlap area on the motherboard mounting area at a working state of the fan connection member. The orthogonal projection of the fan connection member onto the bottom plate has a second overlap area on the motherboard mounting area at a maintenance state of the fan connection member. The first overlap area is larger than the second overlap area.

The above description and the following embodiments are used to demonstrate and explain the spirit and principle of the present disclosure, and provide a further explanation of the claims.

BRIEF DESCRIPTION OF THE DRAWINGS

The present disclosure will become better understood from the detailed description given hereinbelow and the accompanying drawings which are given by way of illustration only and thus are not intended to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
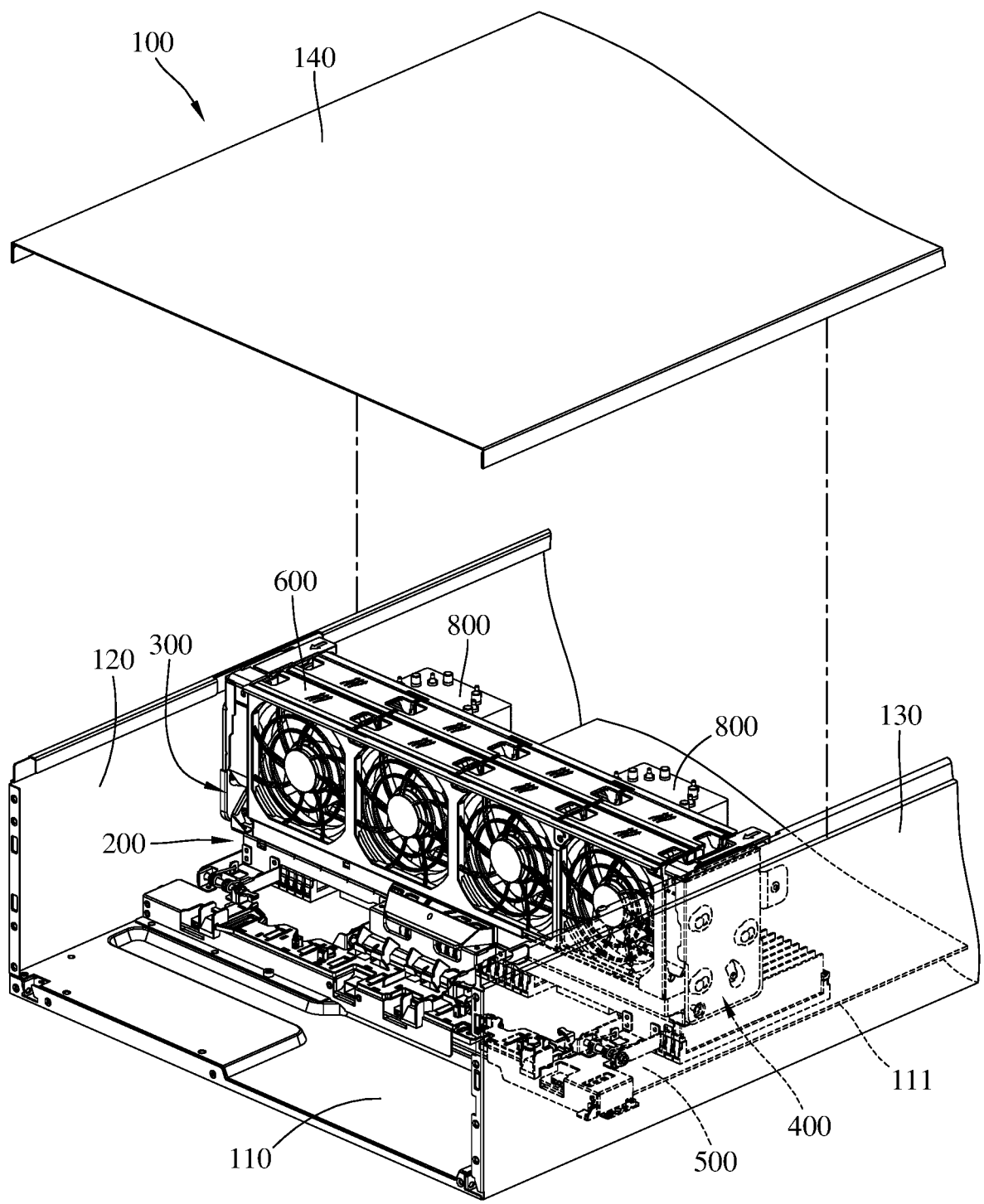
FIG. 1 is a schematic view of the electronic device with its top plate opened according to the first embodiment of the present disclosure.
Figure 2:
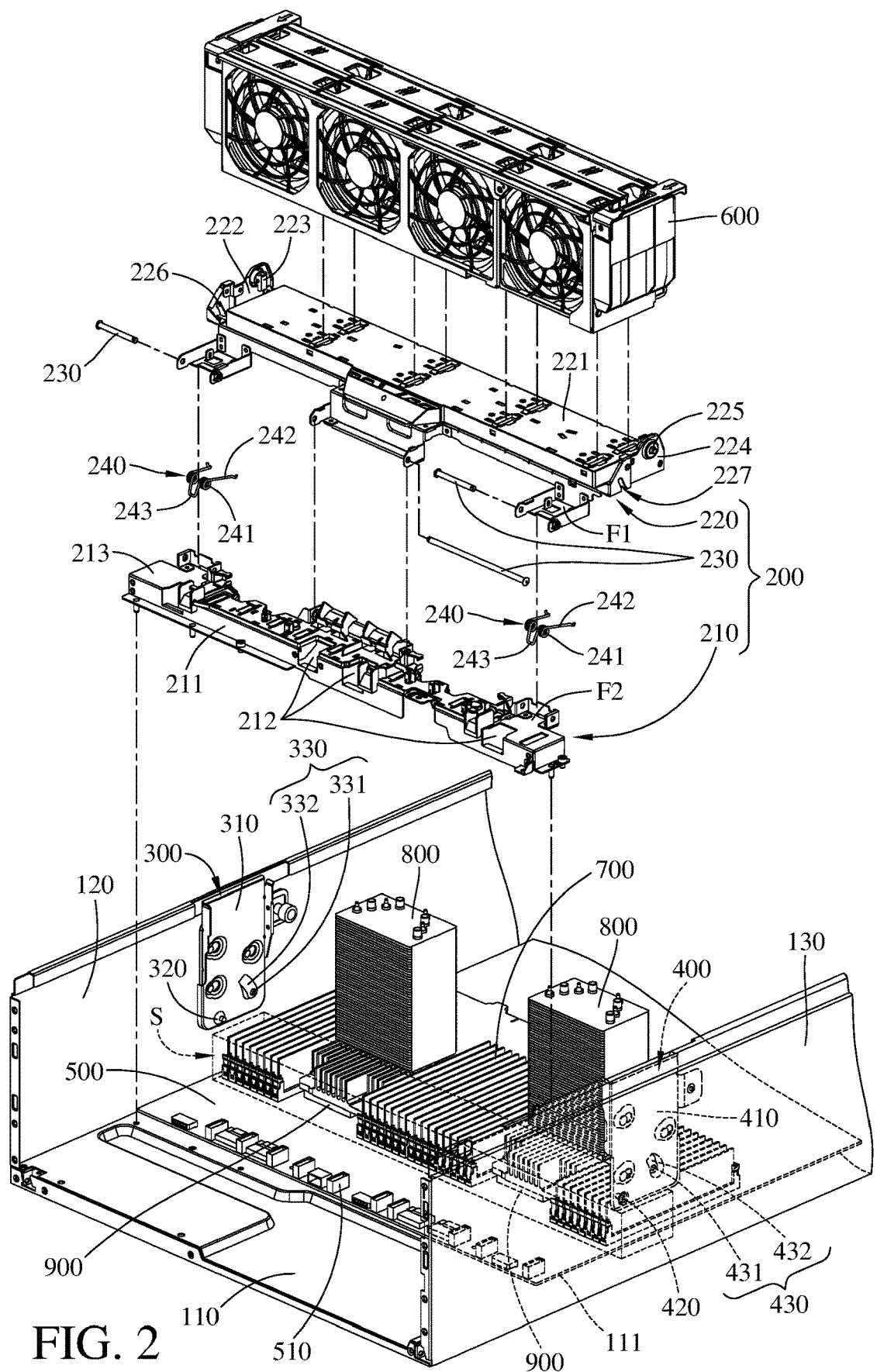
FIG. 2 is an exploded view of the electronic device with its top plate removed according to the first embodiment of the present disclosure.

Please refer to FIG. 1 and FIG. 2. FIG. 1 is a schematic view of the electronic device with its top plate opened according to the first embodiment of the present disclosure. FIG. 2 is an exploded view of the electronic device with its top plate removed according to the first embodiment of the present disclosure. The circuit is not shown in the drawings of the present disclosure for the purpose of clear and concise illustration.

As shown in FIG. 1 and FIG. 2, the electronic device 10 includes a housing 100, a fan connection member 200, a first connection module 300, a second connection module 400, a motherboard 500, a fan module 600, a memory 700, a CPU heat dissipation module 800 and a CPU 900. The fan connection member 200, the first connection module 300, the second connection module 400, the motherboard 500, and the fan module 600 are located in the housing 100. The memory 700 and the CPU 900 are disposed on the motherboard 500. The CPU heat dissipation module 800 is disposed on the CPU 900.

The housing 100 includes a bottom plate 110, a first side plate 120, a second side plate 130, and a top plate 140. The bottom plate 110 and the top plate 140 are disposed opposite to each other. The first side plate 120 and the second side plate 130 stand between the bottom plate 110 and the top plate 140 and connect the bottom plate 110 to the top plate 140. The bottom plate 110 has a double-layer structure constituted by a mounting inner layer 110A and a protecting outer layer 110B. The mounting inner layer 110A is between the protecting outer layer 110B and the top plate 140. The mounting inner layer 110A of the bottom plate 110 has a motherboard mounting area 111 toward the top plate 140.

In this embodiment, the fan connection member 200 is disposed on the mounting inner layer 110A of the bottom plate 110, and the fan connection member 200 is between the first side plate 120 and the second side plate 130. In other embodiments, the fan connection member 200 is removably disposed on the motherboard 500. The fan connection member 200 includes a fan base 210, a fan seat 220, a connection part 230, and a stress member 240. The fan base 210 is disposed on the mounting inner layer 110A of the bottom plate 110 and across a part of the motherboard mounting area 111. An orthogonal projection of the fan base 210 onto the bottom plate 110 overlaps a part of the motherboard mounting area 111. The connection part 230 as a pivot pivots the fan base 210 and fan seat 220, and the fan seat 220 may pivot with respect to the fan base 210, so that the fan connection member 200 may be at a working state and a maintenance state. The stress member 240 is disposed on the connection part 230. An accommodating space S is formed between the fan seat 220 and the mounting inner layer 110A of the bottom plate 110, and the fan base 210 is located out of the accommodating space S.

In detail, the fan base 210 includes a fan base body 211 and two fixing parts 213. The fan base body 211 is across a part of the motherboard mounting area 111. The two fixing parts 213 are located on opposite ends of the fan base body 211, respectively. The fan connection member 200 is removably disposed on the mounting inner layer 110A of the bottom plate 110 by the two fixing part 213. The fan base body 211 has a plurality of openings 212. The openings 212 are used for corresponding the fan power connector 510 and other connectors. The number of the openings 212 may vary depending on the number of the connector of the motherboard.

The fan seat 220 includes a fan seat body 221, a first side part 222, a first switch controller 223, a second side part 224, and a second switch controller 225. The first side part 222 stands on one end of the fan seat body 221. The first switch controller 223 is movably disposed on the first side part 222, and the first switch controller 223 may be at an opened state or a closed state. The description regarding the opened state and the closed state of the first switch controller 223 will be explained in detail later. For example, the first switch controller 223 is a plunger. The fan seat 220 has a first guide hole 226 penetrating through the first side part 222. The first guide hole 226 includes a first limit part 2260 and a first release part 2261 connected with each other, and the first release part 2261 is closer to the fan seat body 221 than the first limit part 2260.

The second side part 224 stands on the other end of the fan seat body 221. That is, the first side part 222 and the second side part 224 stand on opposite ends of the fan seat body 221. The second switch controller 225 is movably disposed on the second side part 224. For example, the second switch controller 225 is a plunger. The fan seat 220 further has a second guide hole 227 penetrating through the second side part 224. The second guide hole 227 includes a second limit part 2270 and a second release part 2271 connected with each other, and the second release part 2271 is closer to the fan seat body 221 than the second limit part 2270. The configuration of the second switch controller 225 and the second guide hole 227 and the configuration of the first switch controller 223 and the first guide hole 226 are consistent.

The connection part 230 connects the fan base body 211 to the fan seat body 221. The number of the connection part 230 is two. A pathway for a circuit (such as a circuit for high-speed transmission, not shown) is between the two adjacent connection parts 230, and the circuit may pass through the openings 212 mentioned above and insert to the fan power connector 510 of the motherboard 500. In other embodiments, the number of the connection part 230 may vary as needed. In this embodiment, the structure of the connection part 230 is a shaft bolt. In another embodiment, the connection part 230 may be any structure which can pivot the fan seat 220 with respect to the fan base 210.

The stress member 240 includes a stress body 241, a forcing end 242, and a supporting end 243. The stress body 241 is disposed on the connection part 230. The forcing end 242 is connected to a forcing surface F1 of the fan seat 220. The supporting end 243 is connected to a supporting surface F2 of the fan base 210. When the fan connection member 200 is at the working state, the forcing surface F1 of the fan seat 220 is opposite to the surface of the bottom plate 110 and directly connected to the fan base 210, and the supporting surface F2 of the fan base 210 is opposite to the surface of the bottom plate 110 and directly connected to the fan seat 220. In this embodiment, the stress member 240 is a torsional spring. In other embodiments, the stress member 240 may be any member that may provide a prestress to pivot the fan seat 220 with respect to the fan base 210. In another embodiment, the stress member 240 may be not provided on the connection part 230.

In this embodiment, the first connection module 300 is removably disposed on the first side plate 120, and the first connection module 300 is located between the fan connection member 200 and the first side plate 120. The fan connection member 200 is removably disposed on the first connection module 300 by the first side part 222.

The first connection module 300 includes a first connection module body 310, a first guide 320, and a first fixing structure 330. The first guide 320 protrudes from the first connection module body 310. The first fixing structure 330 is disposed on the first connection module body 310.

The first guide 320 is disposed with respect to the first guide hole 226. When the fan seat 220 pivots with respect to the fan base 210, the first guide 320 extends into the first guide hole 226 to guide the fan seat 220 to pivot with respect to the fan base 210. In this embodiment, the first guide 320 is a pin. In other embodiments, the first guide 320 may be any structure protruding from the first connection module body 310 and extending into the first guide hole 226.

The first fixing structure 330 includes a first hole 331 and a first guide protrusion 332. The first switch controller 223 may be moved along the first guide protrusion 332. In another embodiment, the first fixing structure 330 is any structure which can be fixed with the first switch controller 223. In another embodiment, the first fixing structure 330 and the first switch controller 223 may be mutually exchanged.

The second connection module 400 includes a second connection module body 410, a second guide 420, and a second fixing structure 430. The second fixing structure 430 includes a second hole 431 and a second guide protrusion 432. Because the position of the second connection module 400 is opposite to the position of the first connection module 300, and the structure of the second connection module 400 and the structure of the first connection module 300 are consistent, the structure of the second connection module 400 will not be described in detail.

The motherboard 500 is disposed on the motherboard mounting area 111, and a part of the motherboard 500 is located between the fan seat body 221 and the bottom plate 110. The motherboard 500 may include members such as a circuit board, a CPU socket, a riser card, a network socket, a signal connection board, a memory installation interface or fan power connector 510. The fan power connector 510 is disposed on the front part of the motherboard 500 and adjacent to the front end of the motherboard 500. The fan seat 220 is electrically connected to the fan power connector 510 of the motherboard 500 through the opening 212.

The memory 700 and the CPU 900 are disposed on the motherboard 500 and located in the accommodating space S between the fan seat body 221 and the motherboard 500. The CPU 900, the memory 700, and the fan power connector 510 are located on the front part of the motherboard 500. The fan module 600 is disposed on the fan seat body 221 and connected to the fan power connector 510 on the motherboard 500 through the fan seat body 221. In other embodiments, the members in the accommodating space S may be only a memory 700 or a CPU 900.

The switching of the fan connection member 200 at a working state or a maintenance state in the first embodiment according to the present disclosure will then be described. Please refer to FIG. 3 to FIG. 7B.

Figure 3:
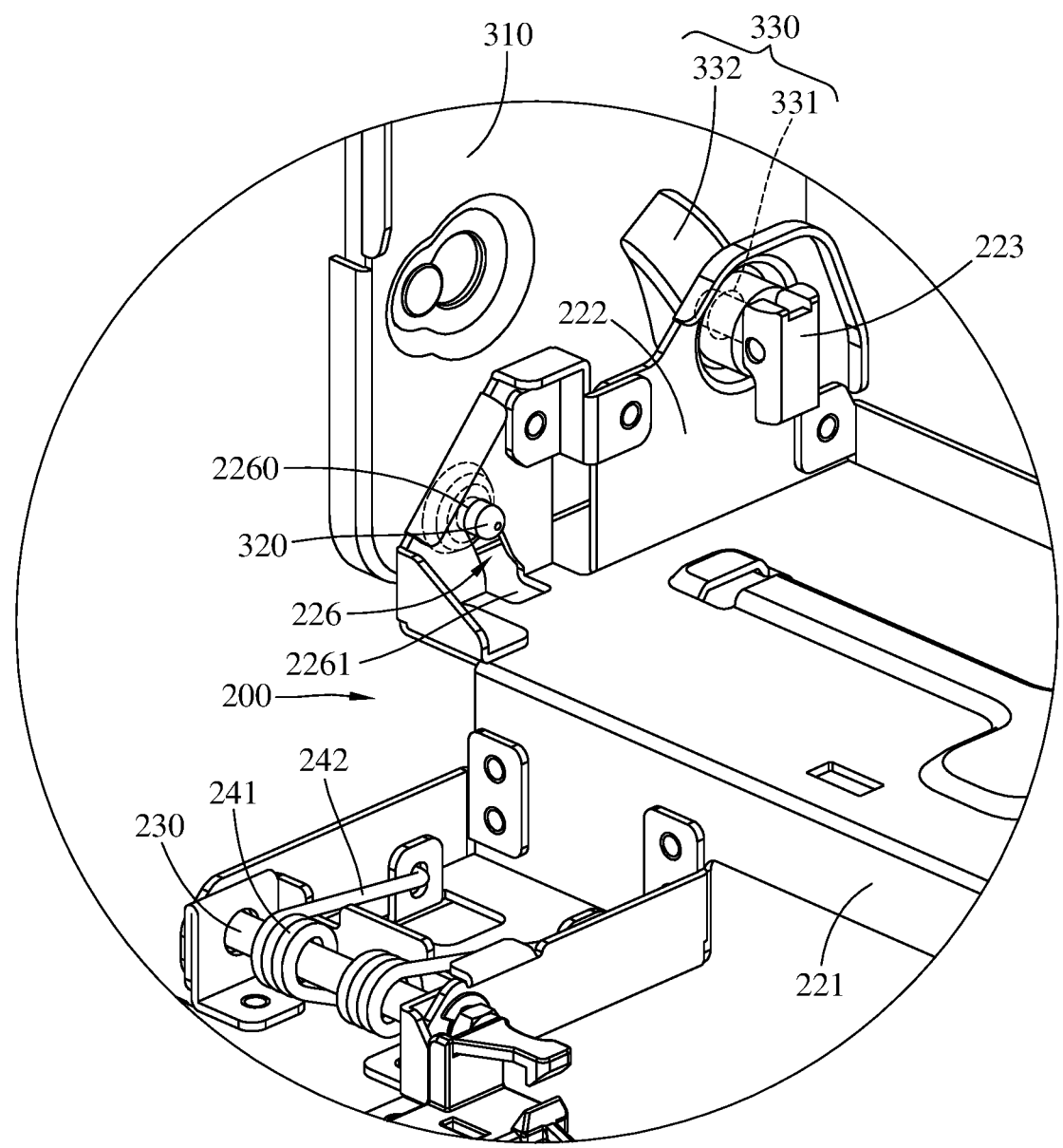
FIG. 3 is a partially enlarged view of the electronic device according to the first embodiment in FIG. 1.
Figure 4A:
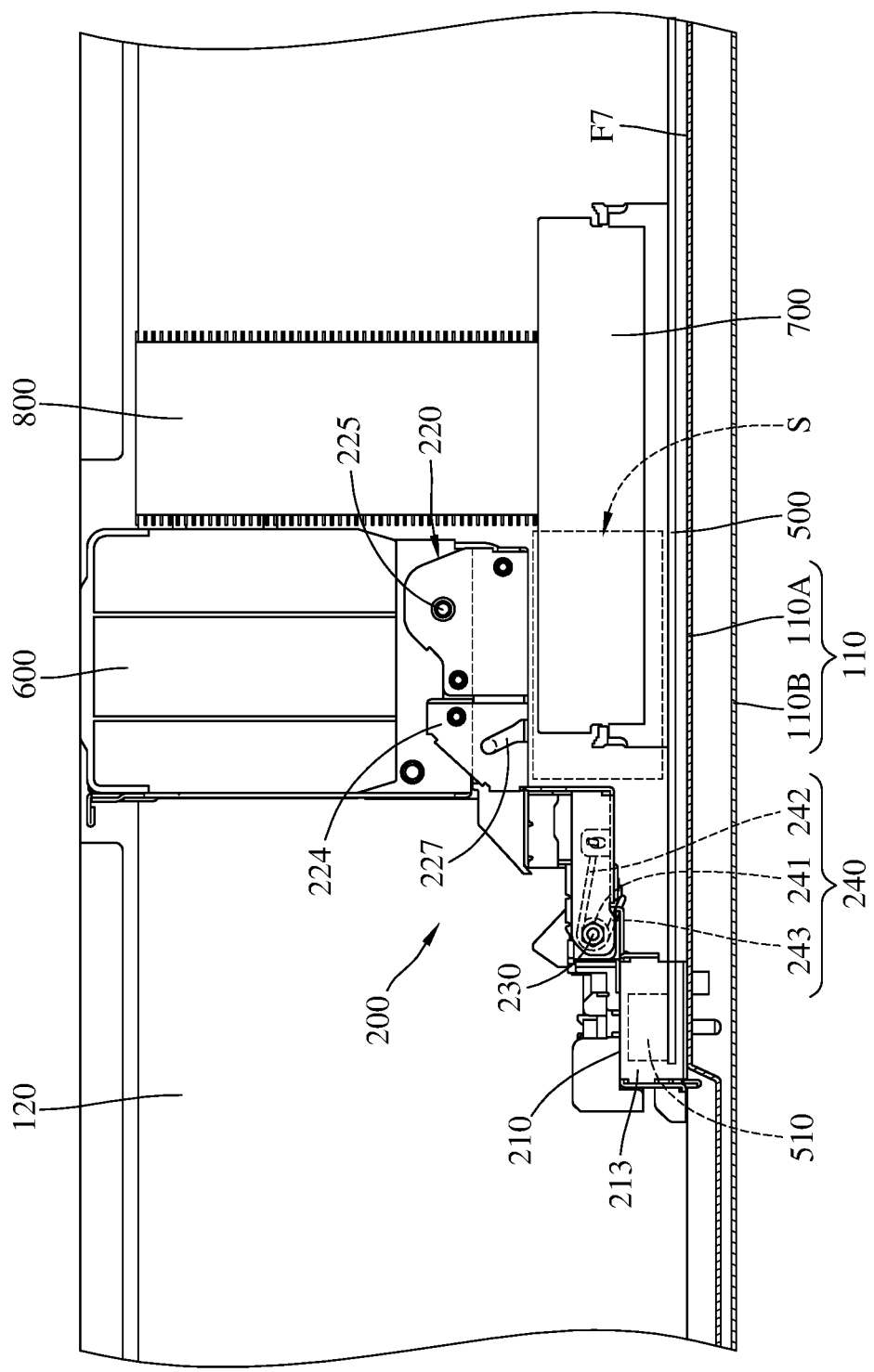
FIG. 4A is a cross-sectional view of the electronic device according to the first embodiment in FIG. 1.
Figure 4B:
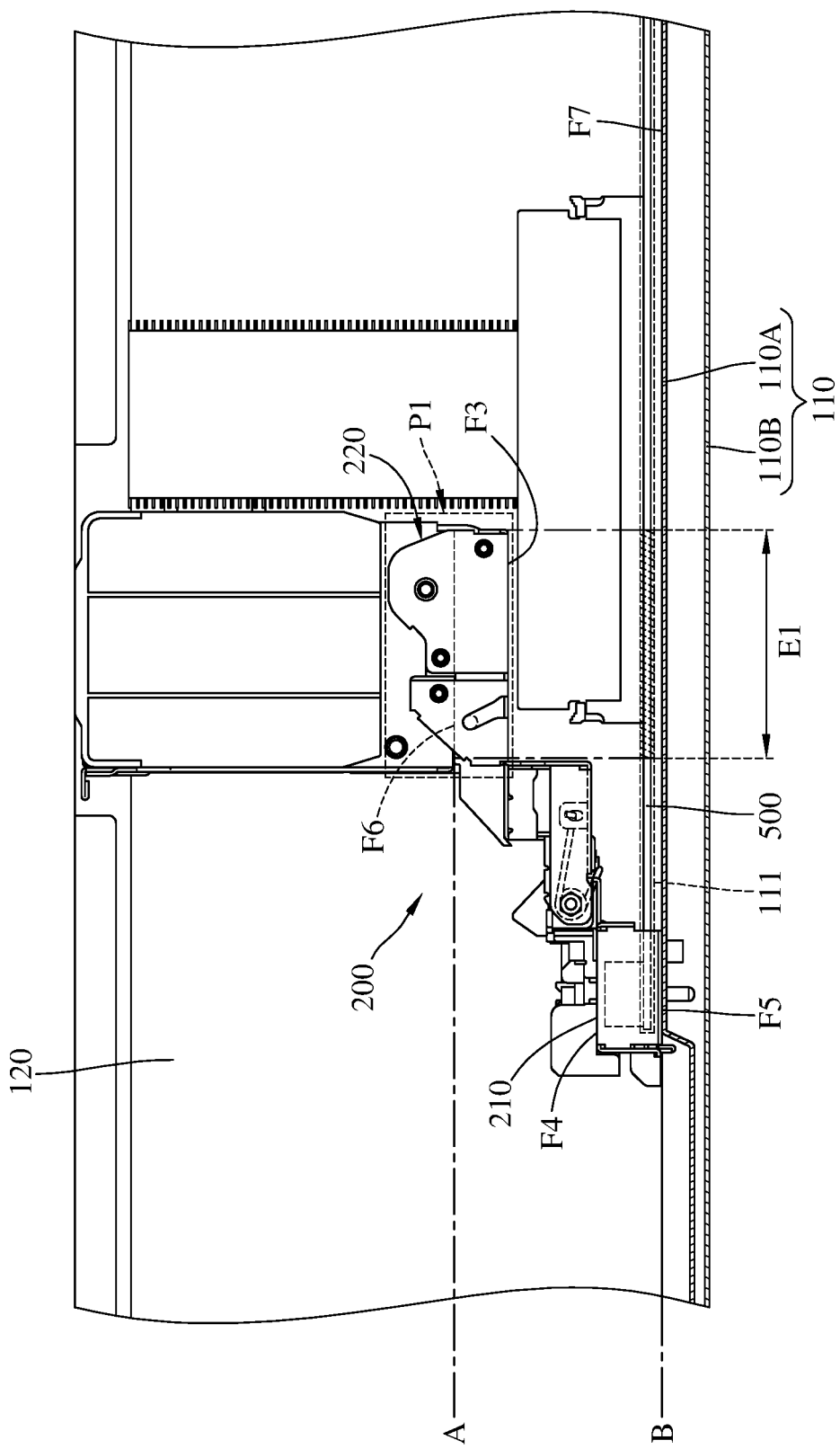
FIG. 4B is a cross-sectional view of the electronic device according to the first embodiment in FIG. 1.
Figure 5:
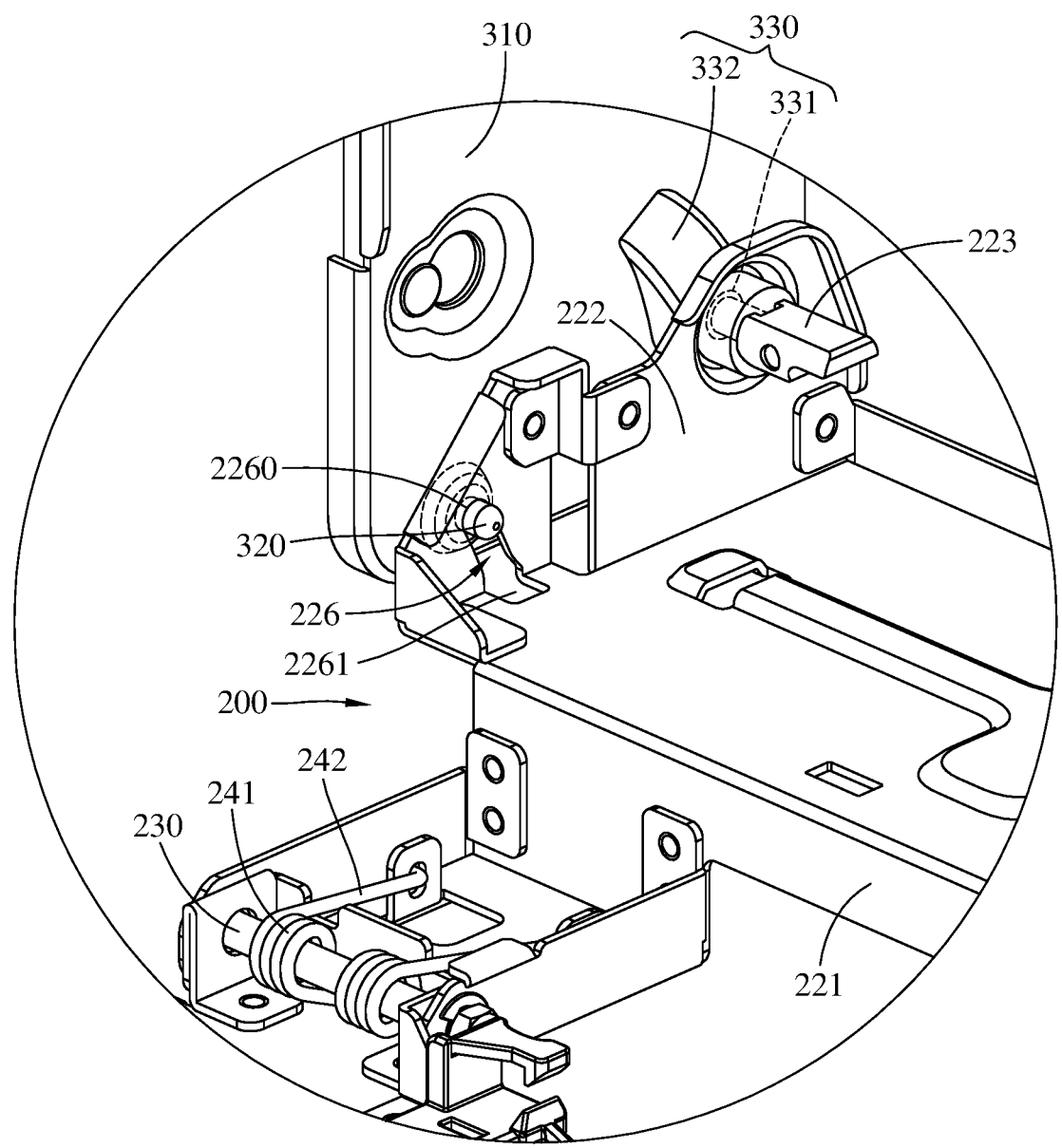
FIG. 5 is a partially enlarged view of the electronic device according to the first embodiment in FIG. 1.
Figure 6:
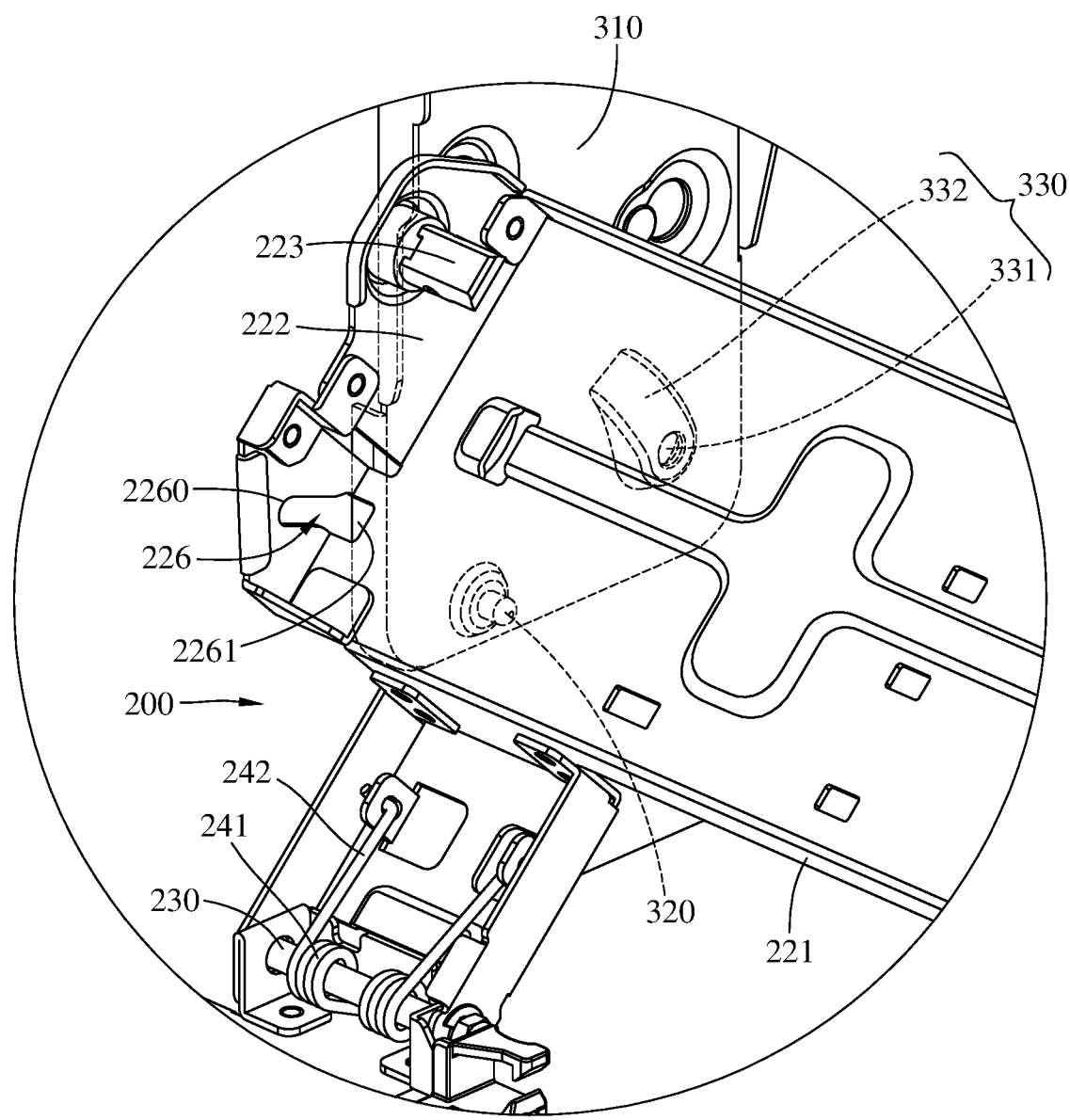
FIG. 6 is a partially enlarged view of the electronic device according to the first embodiment in FIG. 1.
Figure 7A:
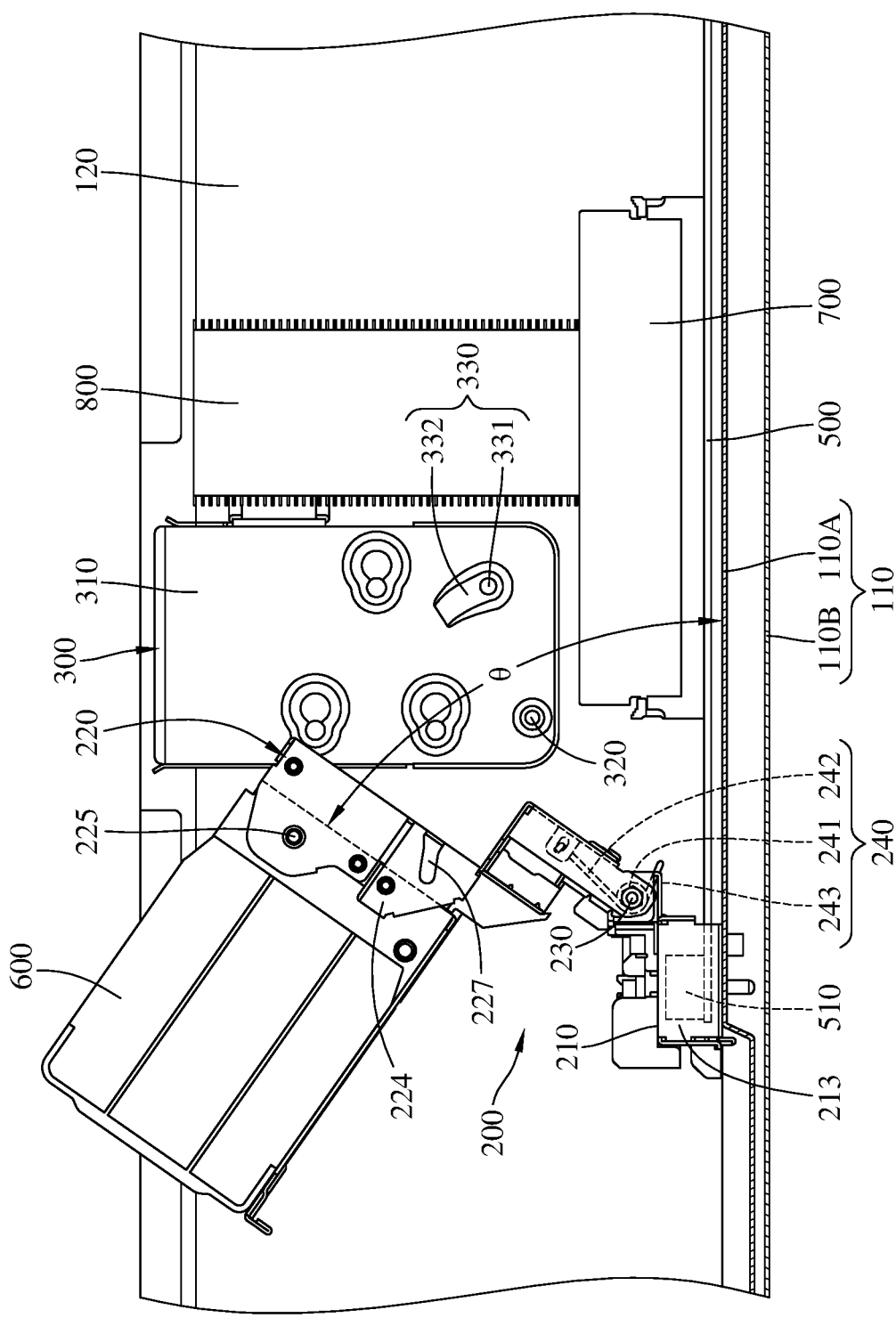
FIG. 7A is a cross-sectional view of the electronic device according to the first embodiment in FIG. 1.
Figure 7B:
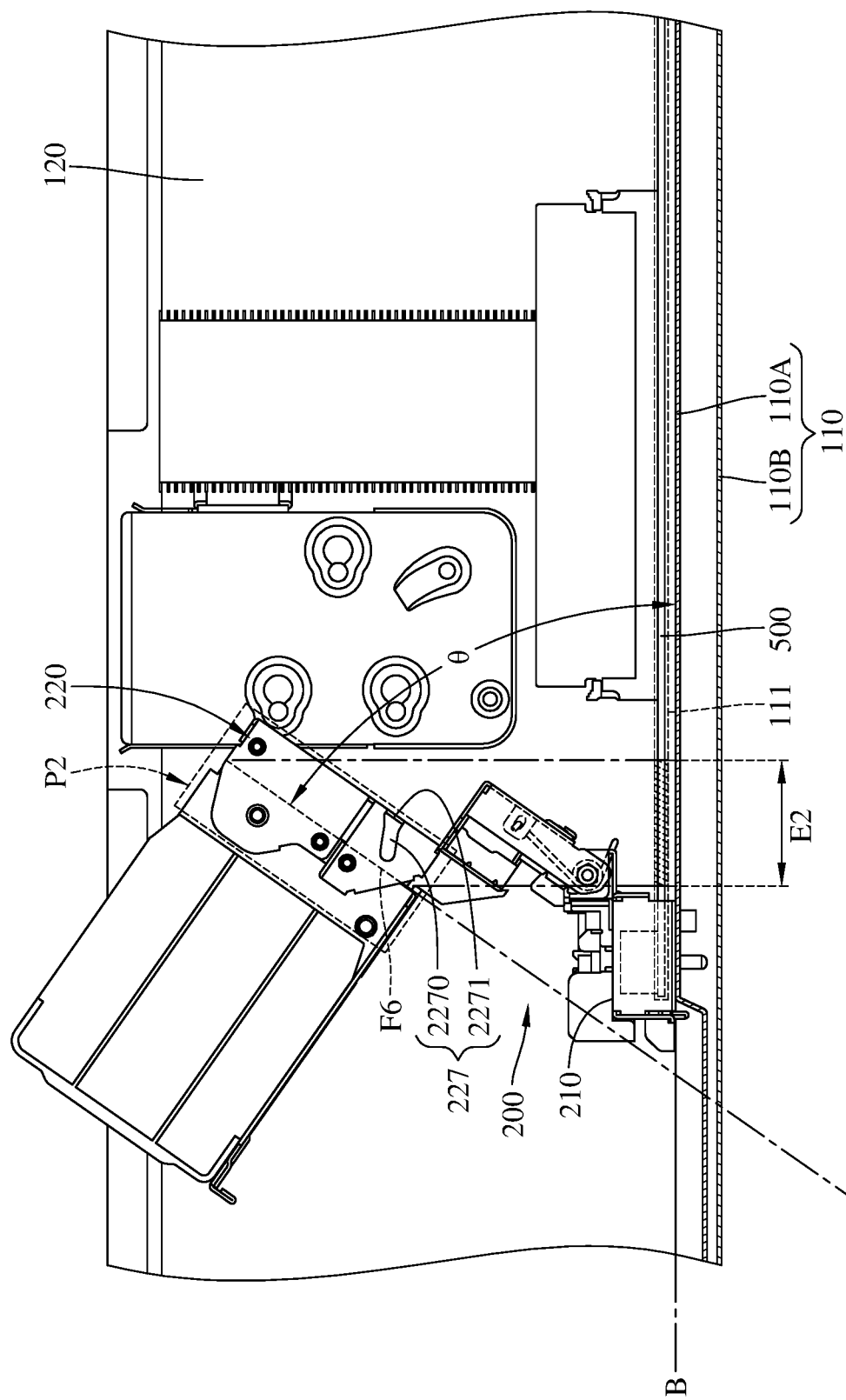
FIG. 7B is a cross-sectional view of the electronic device according to the first embodiment in FIG. 1.

FIG. 3 is a partially enlarged view of the electronic device according to the first embodiment in FIG. 1. FIG. 4A and FIG. 4B are cross-sectional views of the electronic device according to the first embodiment in FIG. 1. FIG. 5 is a partially enlarged view of the electronic device according to the first embodiment in FIG. 1. FIG. 6 is a partially enlarged view of the electronic device according to the first embodiment in FIG. 1. FIG. 7A and FIG. 7B are cross-sectional views of the electronic device according to the first embodiment in FIG. 1. Because the configurations and the operations of the second switch controller 225, the second guide 420, and the second guide hole 227 and the configurations and the operations of the first switch controller 223, the first guide 320, and the first guide hole 226 are consistent, only the configurations and the operations of the first switch controller 223, the first guide 320, and the first guide hole 226 will be described below, and the configurations and the operations of the second switch controller 225, the second guide 420, and the second guide hole 227 will not be described.

Please refer to FIG. 3, FIG. 4A, and FIG. 4B, when the fan connection member 200 is at the working state, the fan seat 220 is at a working position P1. At this time, the first switch controller 223 may be at a lock state or an unlock state. When the first switch controller 223 is at the lock state, the end of the first switch controller 223 extends into the first hole 331 to limit the pivoting of the fan seat 220 with respect to the fan base 210.

The first guide 320 is at the first limit part 2260 of the first guide hole 226, and the first guide 320 interferes with the wall surface away from the fan seat body 221, so that a pivot angle between the fan seat 220 and bottom plate 110 may be limited to prevent the fan seat body 221 from occupying the accommodating space S due to overly movement toward the bottom plate 110. The lower surface F3 of the fan seat 220 is higher than the upper surface F4 of the fan base 210. The connection part 230 is located between the lower surface F5 of the fan base 210 and the upper surface F6 of the fan seat 220. The accommodating space S is formed between the lower surface F3 of the fan seat 220 and the upper surface F7 of the bottom plate 110, and the fan seat 220 covers the accommodating space S. The orthogonal projection of the fan connection member 200 onto the bottom plate 110 has a first overlap area E1 on the motherboard mounting area 111. A first angle is between an extension surface A of the upper surface F6 of the fan seat 220 and an extension surface B of the upper surface F7 of the bottom plate 110, and the first angle approaches 0 degree. In other words, the upper surface F6 of the fan seat 220 and the upper surface F7 of the bottom plate 110 are almost parallel.

Then, please refer to FIG. 5 to FIG. 7B, when a user switches the fan connection member 200 from the working state to the maintenance state, the user firstly toggles the first switch controller 223 to switch the first switch controller 223 from the lock state to the unlock state. When the first switch controller 223 is at the unlock state, the end of the first switch controller 223 does not extend into the first hole 331, so the fan seat 220 may pivot with respect to the fan base 210. Then, a prestress is provided to the fan seat 220 through the deformation of the stress body 241, forcing end 242, and supporting end 243 of the stress member 240 to pivot the fan seat 220 with respect to the fan base 210 and switch from the working position P1 to the maintenance position P2. Therefore, the position of fan seat 220 may pivot with respect to the fan base 210 without manually operating.

During the movement of the fan seat 220 from the working position P1 to the maintenance position P2, the first guide 320 is moved along the first guide hole 226 from the first limit part 2260 to the first release part 2261, and the first guide 320 is detached from the first guide hole 226 through the first release part 2261. In this way, the fixing state between the first side part 222 and the first connection module body 310 is released.

As shown in FIG. 6, FIG. 7A, and FIG. 7B, when the fan connection member 200 is at the maintenance state, the fan seat 220 is at a maintenance position P2. The accommodating space S and the memory 700 or the CPU 900 disposed in the accommodating space S are not covered by the fan seat 220. The orthogonal projection of the fan connection member 200 onto the bottom plate 110 has a second overlap area E2 on the motherboard mounting area 111. The first overlap area E1 is larger than the second overlap area E2. A second angle $\theta$ is between the extension surface A of the upper surface F6 of the fan seat 220 and the extension surface B of the upper surface F7 of the bottom plate 110, and the second angle $\theta$ is 45 degrees greater than the first angle. In another embodiment, the second angle $\theta$ is 45 to 90 degrees greater than the first angle. In another embodiment, the second angle θ is 75 to 90 degrees greater than the first angle.

In this way, when a user needs to maintain the memory 700 or the CPU 900 disposed in the accommodating space S below the fan seat 220, the memory 700 and the CPU 900 disposed in the accommodating space S may be exposed through the configuration which pivots the fan seat 220 with respect to the fan base 210. Therefore, in the first embodiment according to the present disclosure, the user can maintain the memory 700 or the CPU 900 without removing the fan seat 220 of the fan connection member 200.

During the movement of the fan seat 220 from the maintenance position P2 to the working position P1, the first guide 320 is moved into the first guide hole 226 through the first release part 2261, and the first guide 320 is moved to the first limit part 2260 along the first guide hole 226. In this way, the first side part 222 is mutually fixed with the first connection module body 310. Meanwhile, the end of the first switch controller 223 is moved along the first guide protrusion 332 and abutted against the first guide protrusion 332. When the end of the first switch controller 223 passes the edge of the first guide protrusion 332, the first switch controller 223 extends into the first hole 331, so that the first switch controller 223 may limit the pivot of the fan seat 220 with respect to the fan base 210.

Figure 8:
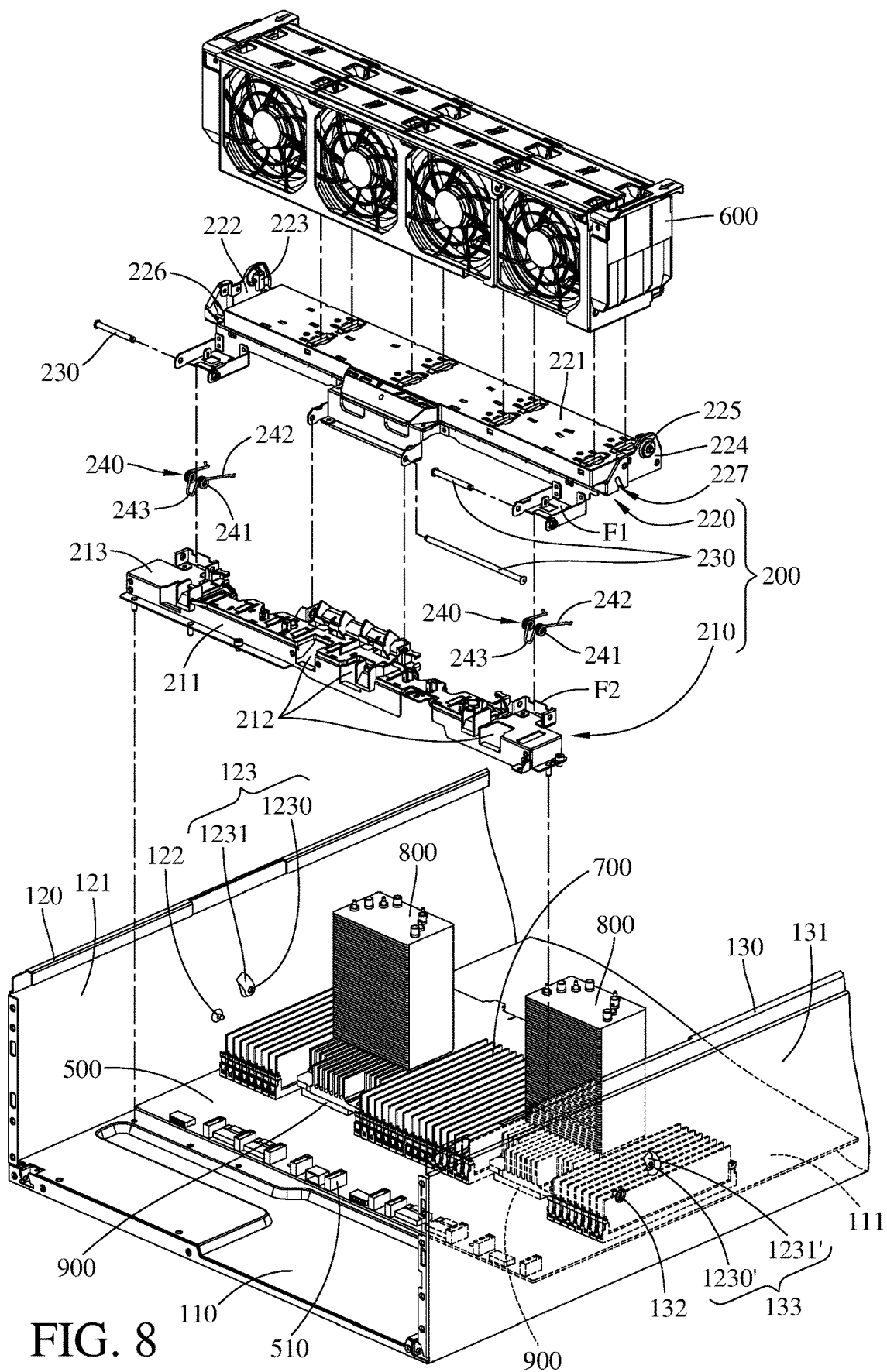
FIG. 8 is a schematic view of the electronic device with its top plate removed according to the second embodiment of the present disclosure.

Please refer to FIG. 8. FIG. 8 is a schematic view of the electronic device with its top plate removed according to the second embodiment of the present disclosure. The electronic device of the second embodiment is similar to the electronic device of the first embodiment, only the differences will be described below, and the same thereof will not be described. The electronic device includes a housing 100, a fan connection member 200, a motherboard 500, a memory 700, a CPU 900, and a fan module 600. The fan connection member 200 is located in the housing 100. That is, the electronic device does not include a first connection module 300 and a second connection module 400. The first side part 222 of the fan connection member 200 is removably disposed on the first side plate 120. The second side part 224 of the fan connection member 200 is removably disposed on the second side plate 130.

The first side plate 120 includes a first side plate body 121, a first side guide part 122, and a first side fixing structure 123. The first side fixing structure 123 is disposed on the first side plate body 121. The first side guide part 122 protrudes from the first side plate body 121.

The first side guide part 122 is disposed with respect to the first guide hole 226. The first side guide part 122 slides in the first guide hole 226. The first side guide part 122 is a pin. In other embodiments, the first side guide part 122 may be any structure protruding from the first side plate body 121.

The first side fixing structure 123 includes a side hole 1230 and a side guide protrusion 1231. The side hole 1230 is located in the side guide protrusion 1231. The first switch controller 223 is moved along the side guide protrusion 1231.

The second side plate 130 includes a second side plate body 131, a second side guide part 132, and a second side fixing structure 133. The second side fixing structure 133 includes a side hole 1230' and a side guide protrusion 1231'. The configurations of the second side fixing structure 133, the second side guide part 132, the side hole 1230', and the side guide protrusion 1231' and the configurations of the first side fixing structure 123, the first side guide part 122, the side hole 1230, and the side guide protrusion 1231 are consistent, so the structures thereof will not be described repetitively.

Figure 9:
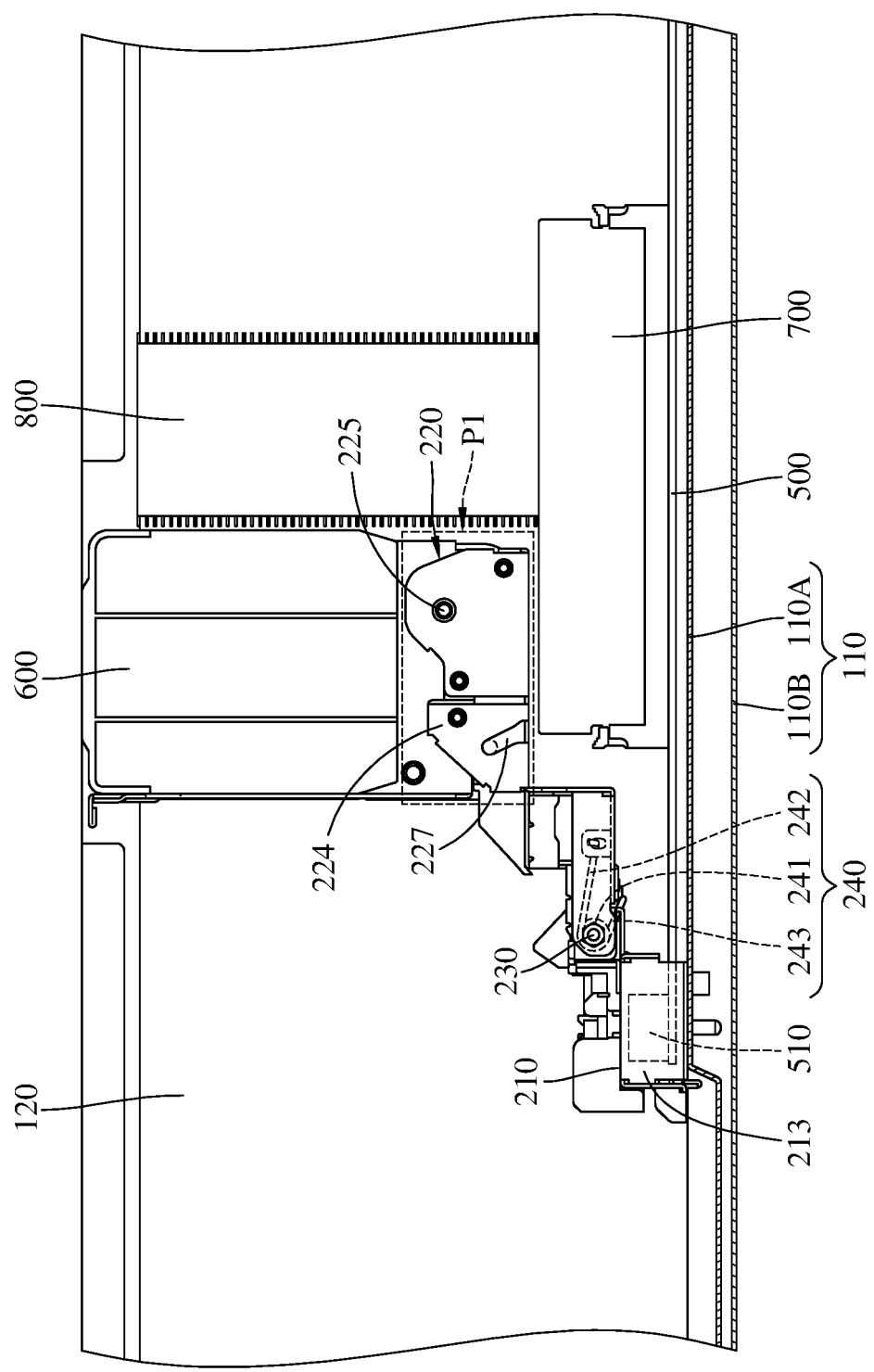
FIG. 9 is a cross-sectional view of the electronic device according to the second embodiment of the present disclosure.
Figure 10:
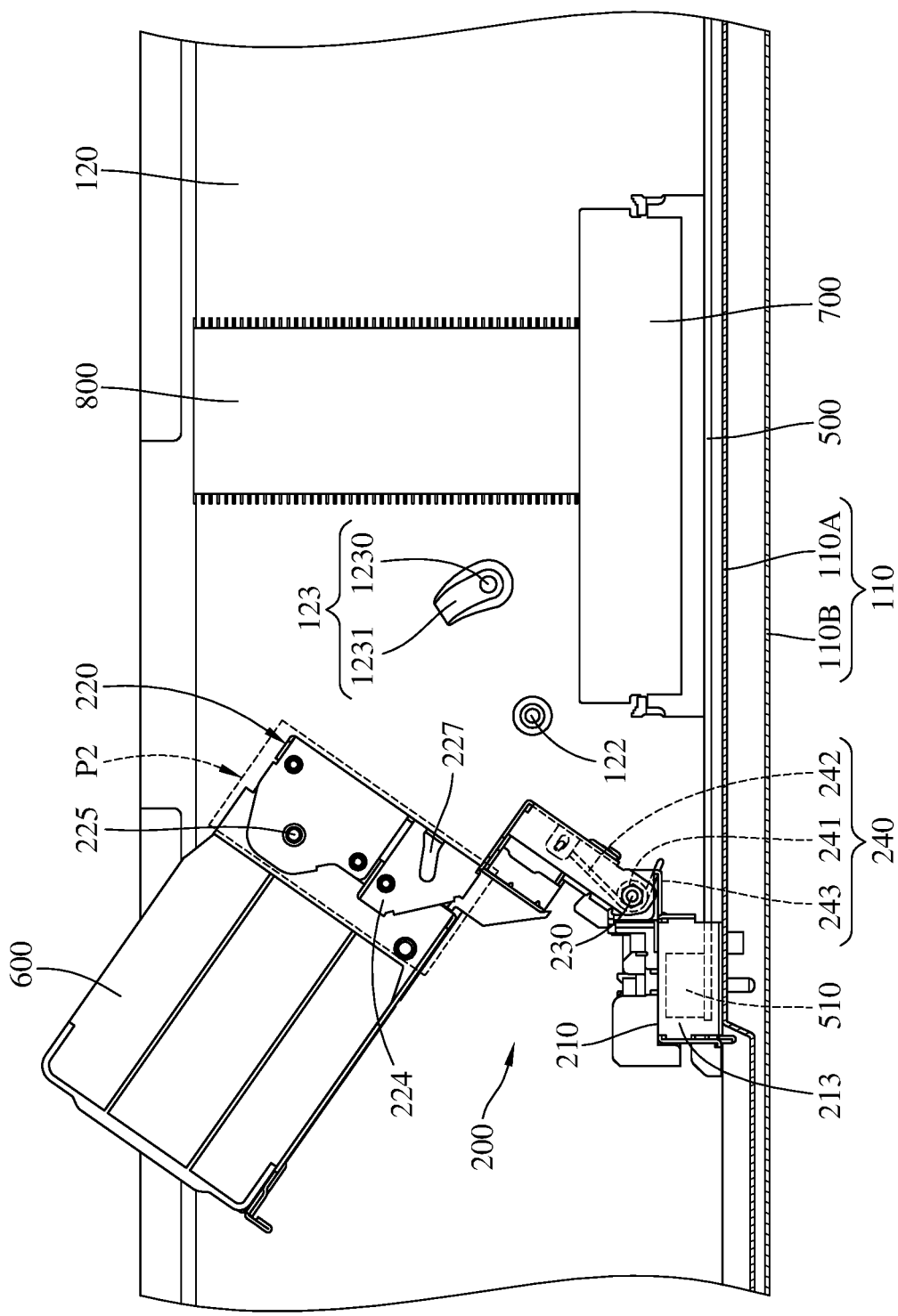
FIG. 10 is a cross-sectional view of the electronic device according to the second embodiment of the present disclosure.

Please refer to FIG. 9 and FIG. 10. FIG. 9 is a cross-sectional view of the electronic device at the working state according to the second embodiment of the present disclosure. FIG. 10 is a cross-sectional view of the electronic device at the maintenance state according to the second embodiment of the present disclosure. The electronic device of the second embodiment is at a working state or a maintenance state similar to the first embodiment. Only the differences will be described below, and the same will not be described, so please refer to FIG. 4A, FIG. 4B, FIG. 7A, and FIG. 7B. Moreover, because the configurations and the operations of the second switch controller 225, the second side guide part 132, and the second guide hole 227 and the configurations and the operations of the first switch controller 223, the first side guide part 122, and the first guide hole 226 are consistent, only the configurations and the operations of the first switch controller 223, the first side guide part 122, and the first guide hole 226 will be described below, and the configurations and the operations of the second switch controller 225, the second side guide part 132, and the second guide hole 227 will not be described.

As shown in FIG. 9, when the fan connection member 200 is at the working state, the fan seat 220 is at a working position P1. When the first switch controller 223 is at a lock state, the end of the first switch controller 223 extends into the side hole 1230 to limit the pivoting of the fan seat 220 with respect to the fan base 210. The first side guide part 112 is at the first limit part 2260 of the first guide hole 226, and the first side guide part 112 interferes with the wall surface away from the fan seat body 221. The orthogonal projection of the fan connection member 200 onto the bottom plate 110 has a first overlap area E1 on the motherboard mounting area 111. A first angle is between an extension surface A of the upper surface F6 of the fan seat 220 and an extension surface B of the upper surface F7 of the bottom plate 110, and the first angle approaches 0 degree.

When the fan connection member 200 is switched from the working state to the maintenance state, the first switch controller 223 is firstly toggled to switch the first switch controller 223 from the lock state to the unlock state. When the first switch controller 223 is at the unlock state, the end of the first switch controller 223 does not extend into the side hole 1230, so the fan seat 220 may pivot with respect to the fan base 210. During the movement of the fan seat 220 from the working position P1 to the maintenance position P2, the first side guide part 122 is moved along the first guide hole 226 from the first limit part 2260 to the first release part 2261, and the first side guide part 122 is detached from the first guide hole 226 through the first release part 2261. In this way, the fixing state between the first side part 222 and the first side plate body 121 is released.

As shown on FIG. 10, when the fan connection member 200 is at the maintenance state, the fan seat 220 is at a maintenance position P2. The orthogonal projection of the fan connection member 200 onto the bottom plate 110 has a second overlap area E2 on the motherboard mounting area 111. The first overlap area E1 is larger than the second overlap area E2. A second angle θ is between the extension surface A of the upper surface F6 of the fan seat 220 and the extension surface B of the upper surface F7 of the bottom plate 110, and the second angle θ is 45 degrees greater than the first angle. The accommodating space S and the memory 700 or the CPU 900 disposed in the accommodating space S are not covered by the fan seat 220.

The operation of switching the fan connection member 200 according to the second embodiment of the present disclosure from the maintenance state to the working state corresponds to the operation of switching the fan connection member 200 according to the first embodiment from the maintenance state to the working state, so please refer to the related description above and FIG. 4A, FIG. 4B, FIG. 7A, and FIG. 7B and will not be described again.

According to the present disclosure, the fan connection member including a fan base and a fan seat pivoted on the fan base, the fan seat is able to pivot with respect to the fan base, so that the fan connection member is at a working state or a maintenance state. In this way, the problem that the electronic devices cannot share a motherboard due to insufficient housing space for accommodating fan module can be solved by using the fan module of the present disclosure, thereby accomplishing high compatibility of a motherboard.

Though the embodiment according to the present disclosure is described above, the present disclosure is not limited thereto. Without departing from the spirit and scope of the present disclosure, any skilled person in the field can do some appropriate change in the shapes, structures, characteristics and spirits. The extent of patent protection subject to the claim in the specification.

What is claimed is:

1. An electronic device, comprising:
   a housing comprising a bottom plate, the bottom plate having a motherboard mounting area; and
   a fan connection member disposed on the bottom plate, an orthogonal projection of the fan connection member onto the bottom plate overlapping a part of the motherboard mounting area, the fan connection member comprising a fan base and a fan seat pivoted on the fan base;
   wherein the orthogonal projection of the fan connection member onto the bottom plate has a first overlap area on the motherboard mounting area at a working state of the fan connection member, the orthogonal projection of the fan connection member onto the bottom plate has a second overlap area on the motherboard mounting area at a maintenance state of the fan connection member, and the first overlap area is larger than the second overlap area;
   wherein a lower surface of the fan seat is higher than an upper surface of the fan base when the fan connection member is at the working state, an accommodating space is formed between the lower surface of the fan seat and an upper surface of the bottom plate, and the fan seat covers the accommodating space; the accommodating space is exposed when the fan connection member is at the maintenance state.

2. The electronic device of claim 1, wherein the housing further comprises two side plates, the bottom plate is disposed between the two side plates, each of the side plates has a fixing structure, the fan seat comprises a fan seat body, a first switch controller and a second switch controller, the first switch controller and the second switch controller are respectively disposed on opposite ends of the fan seat body, and the first switch controller and the second switch controller are respectively fixed with the fixing structures when the fan connection member is at the working state.

3. The electronic device of claim 1, wherein the housing further comprises two side plates and two connection modules, the bottom plate is disposed between the two side plates, the connection modules are removably disposed on the side plates, respectively, the connection modules are located between the two side plates, each of the connection modules has a fixing structure, the fan seat comprises a fan seat body, a first side part, a first switch controller, a second side part and a second switch controller, the first side part and the second side part respectively stand on opposite ends of the fan seat, the first switch controller and second switch controller are respectively disposed on the first side part and the second side part, and the first switch controller and the second switch controller are respectively fixed with the fixing structures when the fan connection member is at the working state.

4. The electronic device of claim 3, wherein the fan seat body has a first guide hole and a second guide hole, the first guide hole and the second guide hole are respectively disposed on the first side part and the second side part; each of the connection modules comprises a connection module body and a guide protruding from the connection module body, the guides are slidingly disposed on the first guide hole and the second guide hole, respectively.

5. The electronic device of claim 1, wherein a first angle is between an upper surface of the fan seat and the bottom plate when the fan connection member is at the working state; a second angle is between the upper surface of the fan seat and the bottom plate when the fan connection member is at the maintenance state, the second angle is 45 degrees greater than the first angle.

6. The electronic device of claim 1, wherein the fan connection member further comprises a stress member, the stress member comprises a stress body, a forcing end and a supporting end, the forcing end is connected to a forcing surface of the fan seat, the supporting end is connected to a supporting surface of the fan base, the forcing surface of the fan seat is opposite to the bottom plate, the supporting surface of the fan base is opposite to the bottom plate.

7. An electronic device, comprising:
   a housing comprising a bottom plate, the bottom plate having a motherboard mounting area; and
   a fan connection member disposed on the bottom plate, an orthogonal projection of the fan connection member onto the bottom plate overlapping a part of the motherboard mounting area, the fan connection member comprising a fan base and a fan seat pivoted on the fan base;
   a motherboard disposed on the motherboard mounting area of the bottom plate, the fan seat electrically connected to the motherboard, and a part of the motherboard located between the fan base and the bottom plate; and
   a fan module disposed on the fan seat,
   wherein the orthogonal projection of the fan connection member onto the bottom plate has a first overlap area on the motherboard mounting area at a working state of the fan connection member, the orthogonal projection of the fan connection member onto the bottom plate has a second overlap area on the motherboard mounting area at a maintenance state of the fan connection member, and the first overlap area is larger than the second overlap area;
   wherein a lower surface of the fan seat is higher than an upper surface of the fan base when the fan connection member is at the working state, an accommodating space is formed between the lower surface of the fan seat and an upper surface of the bottom plate, and the fan seat covers the accommodating space; the accommodating space is exposed when the fan connection member is at the maintenance state.

8. The electronic device of claim 7, wherein,
when the fan connection member is at the working state, the fan seat is at a working position, and a first angle is between an upper surface of the fan seat and the bottom plate,
when the fan connection member is at the maintenance state, the fan seat is at a maintenance position, and a second angle is between the upper surface of the fan seat and the bottom plate, and
the second angle is 45 degrees greater than the first angle.

* * * * *